US011876085B2

(12) United States Patent
Roy et al.

(10) Patent No.: US 11,876,085 B2
(45) Date of Patent: Jan. 16, 2024

(54) PACKAGE WITH A SUBSTRATE COMPRISING AN EMBEDDED CAPACITOR WITH SIDE WALL COUPLING

(71) Applicant: QUALCOMM Incorporated, San Diego, CA (US)

(72) Inventors: Abinash Roy, San Diego, CA (US); Lohith Kumar Vemula, San Diego, CA (US); Bharani Chava, Cork City (IE); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 41 days.

(21) Appl. No.: 17/358,838

(22) Filed: Jun. 25, 2021

(65) Prior Publication Data

US 2022/0415868 A1    Dec. 29, 2022

(51) Int. Cl.
| | |
|---|---|
| H01L 25/16 | (2023.01) |
| H01L 21/48 | (2006.01) |
| H01L 23/13 | (2006.01) |
| H01L 23/498 | (2006.01) |
| H01L 23/64 | (2006.01) |
| H01G 4/232 | (2006.01) |

(52) U.S. Cl.
CPC .......... H01L 25/16 (2013.01); H01L 21/4803 (2013.01); H01L 21/4857 (2013.01); H01L 23/13 (2013.01); H01L 23/49822 (2013.01); H01L 23/642 (2013.01); *H01G 4/232* (2013.01)

(58) Field of Classification Search
CPC ... H10L 25/16; H10L 21/4803; H10L 23/642; H01L 21/4857; H01L 23/13; H01L 23/49822

USPC ........................................................ 361/763
See application file for complete search history.

(56) References Cited

U.S. PATENT DOCUMENTS

| | | | |
|---|---|---|---|
| 9,293,426 B2 | 3/2016 | Hossain et al. |
| 10,325,891 B1 | 6/2019 | Lim et al. |
| 2014/0217575 A1 | 8/2014 | Hung |
| 2014/0291818 A1 | 10/2014 | Zhao et al. |
| 2015/0062852 A1 | 3/2015 | Lee et al. |
| 2016/0086930 A1 | 3/2016 | Koey et al. |
| 2017/0213794 A1 | 7/2017 | Baek et al. |
| 2017/0243826 A1 | 8/2017 | Lin et al. |
| 2018/0026022 A1 | 1/2018 | Lee et al. |
| 2019/0088621 A1 | 3/2019 | Yang et al. |

(Continued)

FOREIGN PATENT DOCUMENTS

| | | |
|---|---|---|
| EP | 1635625 A2 | 3/2006 |
| WO | 2015137936 A1 | 9/2015 |

OTHER PUBLICATIONS

International Search Report and Written Opinion—PCT/US2022/031340—ISA/EPO—dated Oct. 11, 2022.

*Primary Examiner* — Tremesha S Willis
(74) *Attorney, Agent, or Firm* — Loza & Loza, LLP

(57) ABSTRACT

A package comprising a substrate and an integrated device coupled to the substrate. The substrate includes at least one dielectric layer, a plurality of interconnects comprising a first interconnect and a second interconnect, a capacitor located at least partially in the substrate, the capacitor comprising a first terminal and a second terminal, a first solder interconnect coupled to a first side surface of the first terminal and the first interconnect, and a second solder interconnect coupled to a second side surface of the second terminal and the second interconnect.

19 Claims, 13 Drawing Sheets

CROSS SECTIONAL PROFILE VIEW

(56) References Cited

U.S. PATENT DOCUMENTS

| | | |
|---|---|---|
| 2019/0131285 A1 | 5/2019 | Kim et al. |
| 2019/0139853 A1 | 5/2019 | Oh et al. |
| 2019/0164893 A1 | 5/2019 | Kim et al. |
| 2019/0189549 A1 | 6/2019 | Jo et al. |
| 2019/0229047 A1 | 7/2019 | Moon et al. |
| 2019/0237406 A1 | 8/2019 | Choi et al. |
| 2020/0051901 A1 | 2/2020 | Hossain et al. |
| 2020/0135839 A1 | 4/2020 | Kang et al. |
| 2021/0057397 A1 | 2/2021 | Kang et al. |

CROSS SECTIONAL PROFILE VIEW

CROSS SECTIONAL PROFILE VIEW

CROSS SECTIONAL PROFILE VIEW

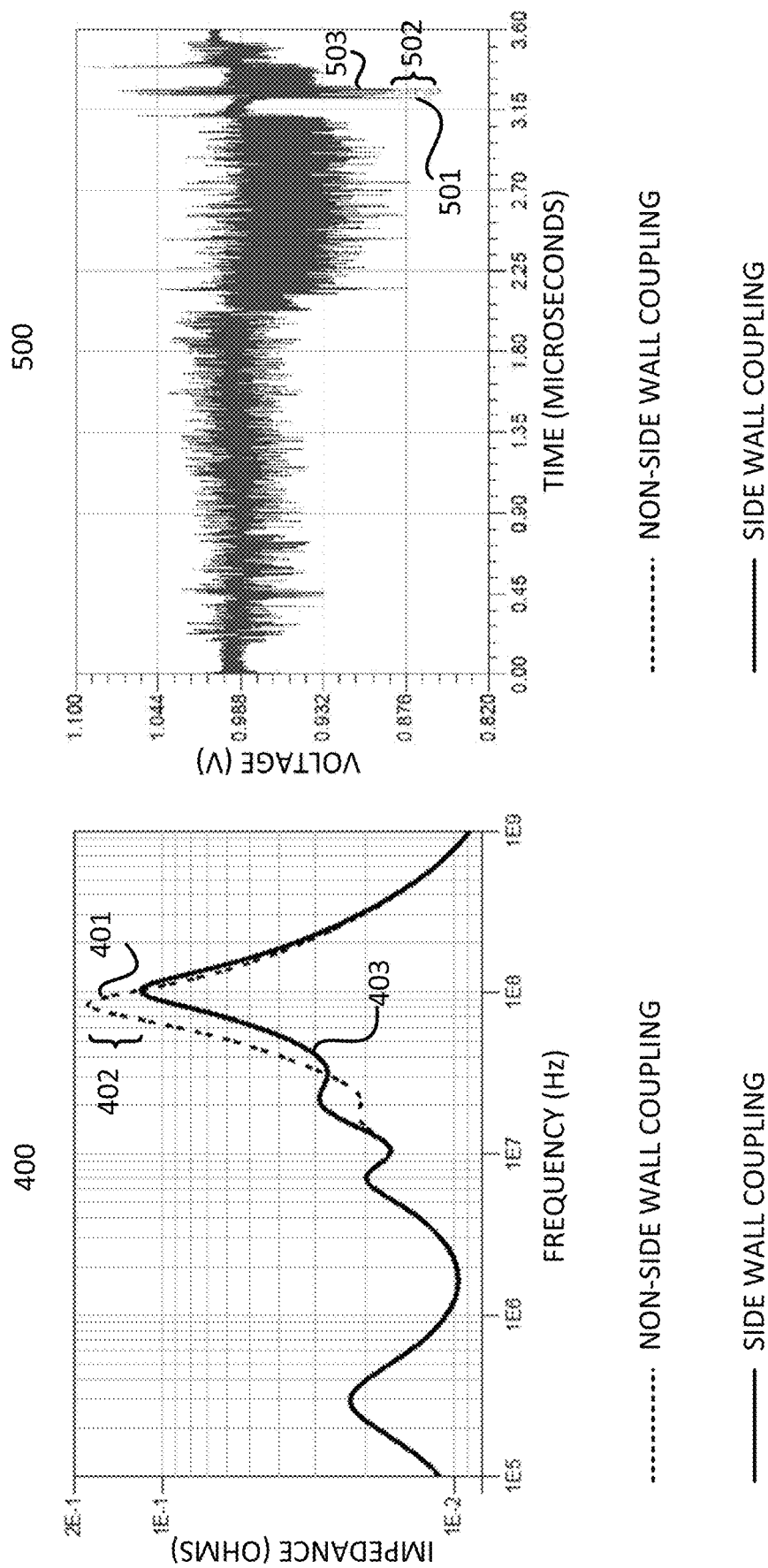

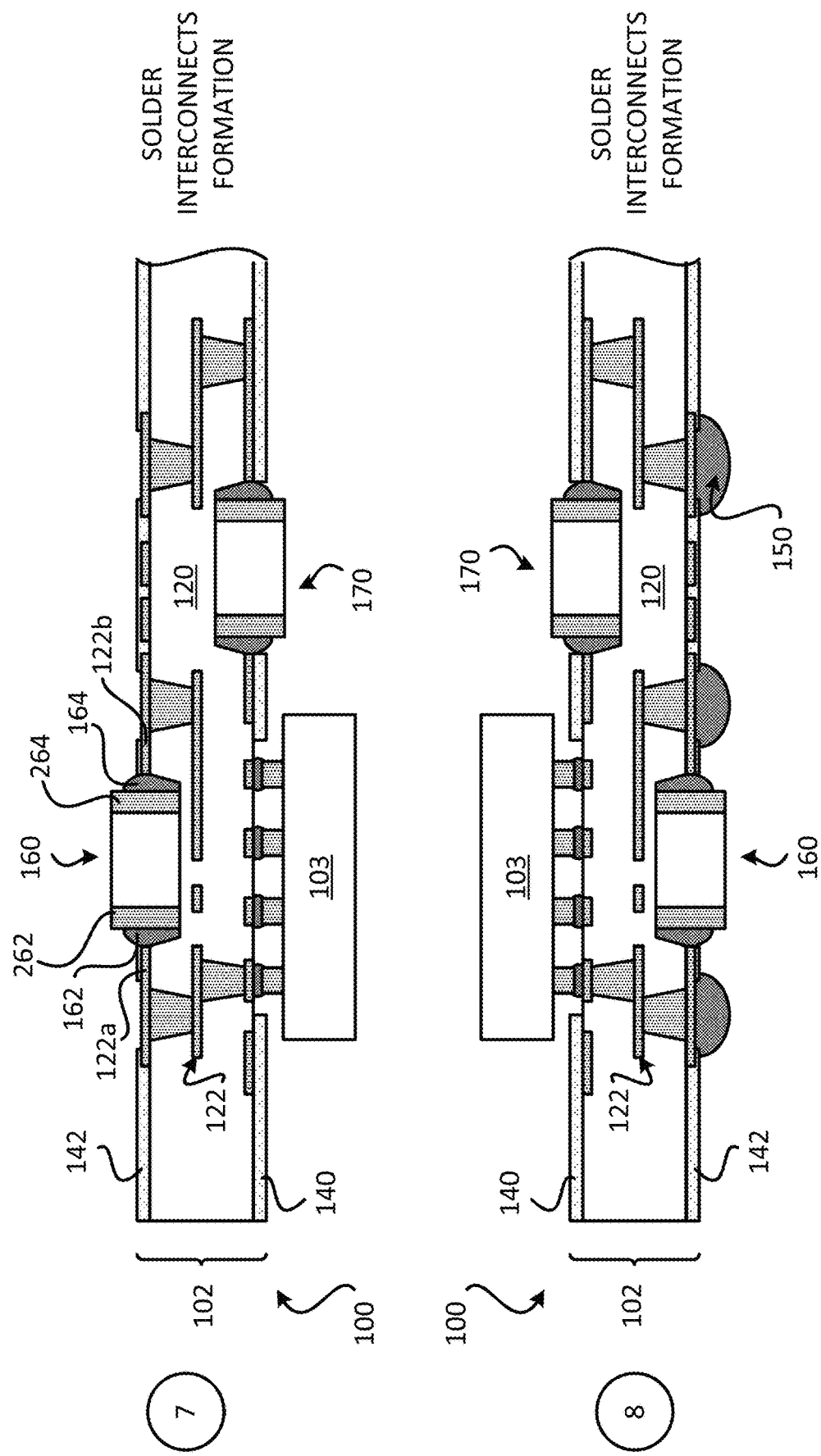

PACKAGE WITH A SUBSTRATE COMPRISING AN EMBEDDED CAPACITOR WITH SIDE WALL COUPLING

FIELD

Various features relate to packages that include an integrated device, but more specifically to a package that includes a substrate and an integrated device.

BACKGROUND

A package may include a substrate, an integrated device and a passive device. These components are coupled together to provide a package that may perform various electrical functions. How the integrated device, the substrate and the passive component are coupled together affects how the package performs overall. There is an ongoing need to provide better performing packages.

SUMMARY

Various features relate to packages that include an integrated device, but more specifically to a package that includes a substrate and an integrated device.

One example provides a package comprising a substrate and an integrated device coupled to the substrate. The substrate includes at least one dielectric layer, a plurality of interconnects comprising a first interconnect and a second interconnect, a capacitor located at least partially in the substrate, the capacitor comprising a first terminal and a second terminal, a first solder interconnect coupled to a first side surface of the first terminal and the first interconnect, and a second solder interconnect coupled to a second side surface of the second terminal and the second interconnect.

Another example provides a substrate that includes at least one dielectric layer, a plurality of interconnects comprising a first interconnect and a second interconnect, a capacitor located at least partially in the substrate, the capacitor comprising a first terminal and a second terminal, a first solder interconnect coupled to a first side surface of the first terminal and the first interconnect, and a second solder interconnect coupled to a second side surface of the second terminal and the second interconnect.

Another example provides a board that includes at least one dielectric layer, a plurality of interconnects comprising a first interconnect and a second interconnect, a capacitor located at least partially in the board, the capacitor comprising a first terminal and a second terminal, a first solder interconnect coupled to a first side surface of the first terminal and the first interconnect, and a second solder interconnect coupled to a second side surface of the second terminal and the second interconnect.

Another example provides a method for fabricating a package. The method provides a substrate that includes at least one dielectric layer, a plurality of interconnects comprising a first interconnect and a second interconnect, and at least one cavity located in the substrate. The method places a capacitor at least partially in the cavity of the substrate. The capacitor includes a first terminal and a second terminal. The method couples a first solder interconnect to a first side surface of the first terminal and the first interconnect. The method couples a second solder interconnect to a second side surface of the second terminal and the second interconnect. The method couples an integrated device to the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates a chart that illustrates impedance performance of a power distribution network (PDN) for different couplings of a capacitor to a substrate.

FIG. 5 illustrates a chart that illustrates voltage droop performance of a power distribution network (PDN) for different couplings of a capacitor to a substrate.

FIGS. 8A-8D illustrate an exemplary sequence for fabricating a package that includes a substrate with an embedded passive device with side wall coupling.

DETAILED DESCRIPTION

In the following description, specific details are given to provide a thorough understanding of the various aspects of the disclosure. However, it will be understood by one of ordinary skills in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The substrate includes at least one dielectric layer, a plurality of interconnects comprising a first interconnect and a second interconnect, a capacitor located at least partially in the substrate, the capacitor comprising a first terminal and a second terminal, a first solder interconnect coupled to a first side surface of the first terminal and the first interconnect, and a second solder interconnect coupled to a second side surface of the second terminal and the second interconnect. A center portion of the first side surface of the first terminal may be planar to a metal layer of the substrate. The center portion of the first side surface of the first terminal may be planar to the bottom metal layer or top metal layer of the substrate. The first side surface of the first terminal may face a side wall of the first interconnect. The second side surface of the second terminal may face a side wall of the second interconnect. The integrated device and the capacitor may be part of a power distribution network (PDN) for the package. The configuration of coupling the side surfaces of the terminals to the side wall of interconnects may help reduce impedance between the capacitor and the interconnects of the substrate. This may also help decrease the voltage droop through the capacitor. The end result may be a package with improved PDN performance.

Figure 1:
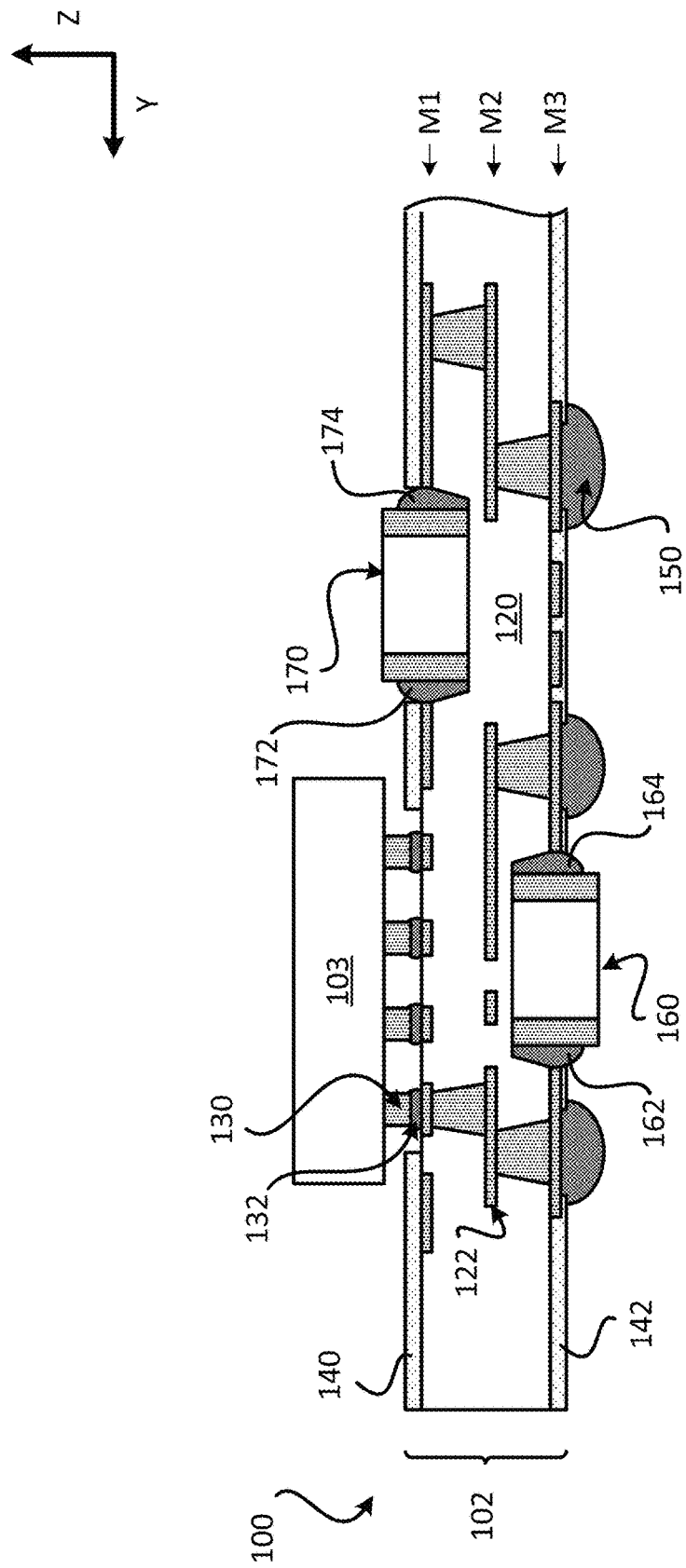
FIG. 1 illustrates a cross sectional profile view of a package that includes an integrated device, a substrate and a passive device.

Exemplary Package Comprising a Substrate with an Embedded Capacitor with Side Wall Coupling FIG. 1 illustrates a package 100 that includes a substrate with an embedded capacitor with side wall coupling. The package 100 includes a substrate 102, an integrated device 103, a capacitor 160 and a capacitor 170. The substrate 102 includes at least one dielectric layer 120, a plurality of interconnects 122, a solder resist layer 140 and a solder resist layer 142. A plurality of solder interconnects 150 is coupled to the substrate 102. The substrate 102 includes three metal layers (e.g., M1, M2, M3). However, different implementations may have different numbers of metal layers. The substrate 102 may include at least one cavity, which is further described below. The integrated device 103 is coupled to the substrate 102. For example, the integrated device 103 is coupled to a first surface (e.g., top surface) of the substrate 102 through a plurality of pillar interconnects 130 and a plurality of solder interconnects 132.

The capacitor 160 is located at least partially in the substrate 102. For example, the capacitor 160 may be embedded through a second surface (e.g., bottom surface) of the substrate 102. A solder interconnect 162 may be coupled to a first terminal of the capacitor 160. A solder interconnect 164 may be coupled to a second terminal of the capacitor 160.

The capacitor 170 is located at least partially in the substrate 102. For example, the capacitor 170 may be embedded through a first surface (e.g., top surface) of the substrate 102. A solder interconnect 172 may be coupled to a first terminal of the capacitor 170. A solder interconnect 174 may be coupled to a second terminal of the capacitor 170.

The capacitor 160 and/or the capacitor 170 may be a means for capacitance. The capacitor 160 and/or the capacitor 170 may each be a discrete capacitor. As will be further described below, the capacitor 160 and the capacitor 170 are embedded in the substrate 102 (e.g., located at least partially in a cavity of the substrate 102) such that a side surface of the capacitor (e.g., 160, 170) faces a side wall of interconnects of the substrate 102. As will be further described below, placing and positioning the capacitor 160 and the capacitor 170 in the substrate 102 in such a manner helps improve the impedance between the capacitor and substrate, voltage variations, and/or voltage droop.

Figure 2:
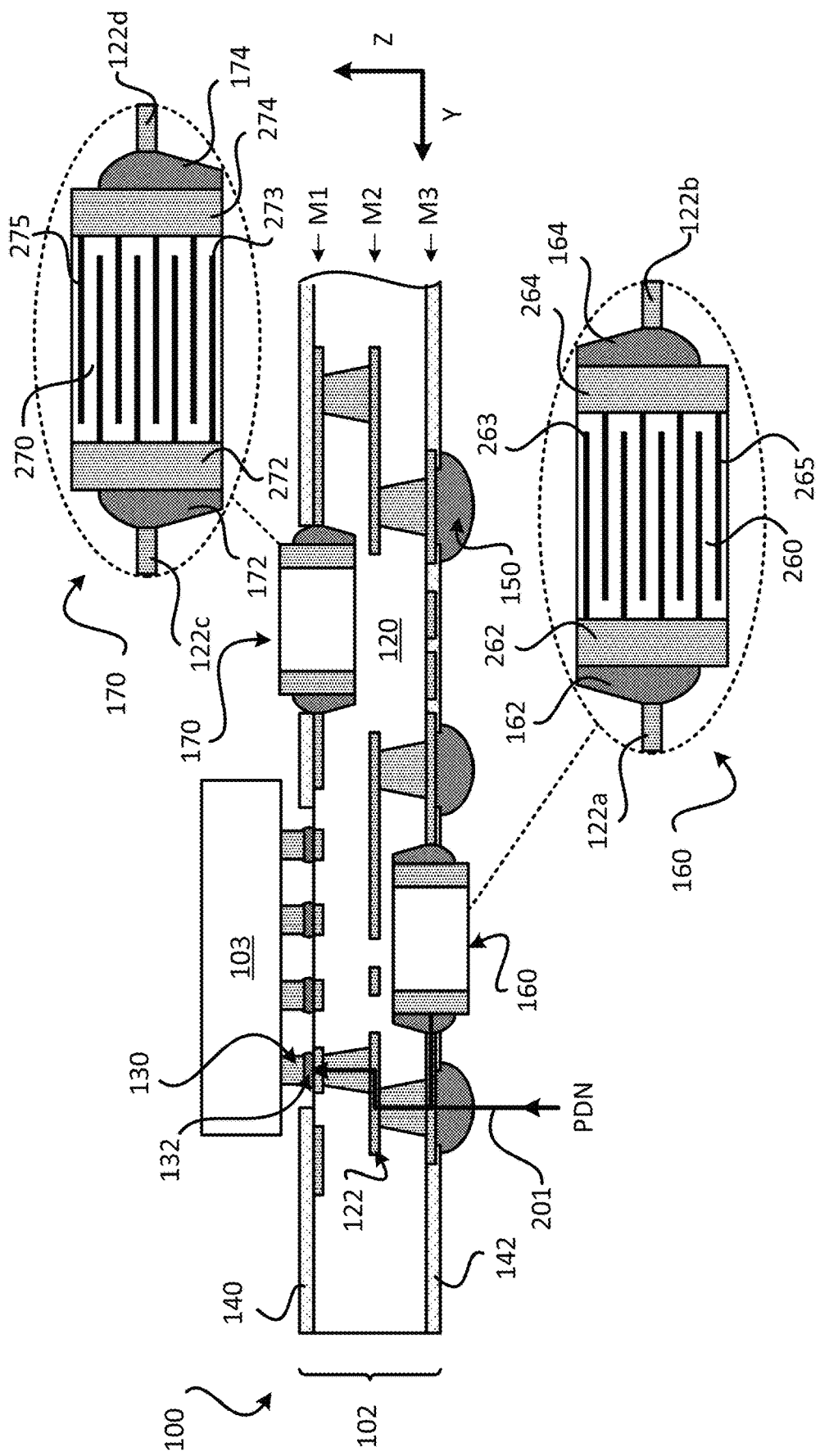
FIG. 2 illustrates a cross sectional profile view of a package that includes an integrated device, a substrate and a passive device.

FIG. 2 illustrates a more detailed cross sectional profile view of the package 100 and the capacitors. As shown in FIG. 2, the substrate 102 includes the plurality of interconnects 122. The plurality of interconnects 122 includes an interconnect 122a, an interconnect 122b, an interconnect 122c and an interconnect 122d. The interconnect 122a may be a first interconnect. The interconnect 122b may be a second interconnect. The interconnect 122c may be a third interconnect. The interconnect 122d may be a fourth interconnect. However, it is noted that any interconnect may be the first interconnect, the second interconnect, the third interconnect or the fourth interconnect.

The capacitor 160 includes a capacitor dielectric layer 260, a first terminal 262, a second terminal 264, a first plurality of plates 263, and a second plurality of plates 265. The first plurality of plates 263 is coupled to the first terminal 262. The second plurality of plates 265 is coupled to the second terminal 264. The first terminal 262 may include a metal pad. The first terminal 262 may include a top surface, a bottom surface and a side surface. The second terminal 264 may include a metal pad. The second terminal 264 may include a top surface, a bottom surface and a side surface.

The first plurality of plates 263 and the second plurality of plates 265 are aligned along at least one plane that is parallel to one or more metal layers (e.g., M1, M2, M3) of the substrate 102. The side surface of the first terminal 262 may be perpendicular to the first plurality of plates 263. The side surface of the second terminal 264 may be perpendicular to the second plurality of plates 265. In some implementations, one or more of the plates from the first plurality of plates 263 and/or the second plurality of plates 265 may be planar to a metal layer (e.g., M3) of the substrate 102. The M3 metal layer may be a third metal layer and/or a bottom metal layer of the substrate 102.

The capacitor 160 is located at least partially in the substrate 102. The capacitor 160 may be located in a cavity of the substrate 102. Examples of cavities of the substrate 102 are further illustrated and described below in at least FIGS. 8A-8D. It is noted that a substrate 102 may have a cavity even if the cavity is subsequently filled with a component and/or a material. A center portion (or a portion near the center portion) of the side surface of the first terminal 262 may be planar with a side wall of the interconnect 122a, which is located on the M3 metal layer. The solder interconnect 162 is coupled to the side surface of the terminal 262 and a side wall of the interconnect 122a (e.g., trace). A center portion (or a portion near the center portion) of the side surface of the second terminal 264 may be planar with a side wall of the interconnect 122b, which is located on the M3 metal layer. The solder interconnect 164 is coupled to the side surface of the terminal 264 and a side wall of the interconnect 122b (e.g., trace). This configuration and placement of the capacitor 160 in the substrate 102 help reduce impedance between the capacitor 160 and the substrate 102, which can help reduce voltage droop in the current that is coupled to the capacitor 160. The capacitor 160 and the integrated device 103 may be part of a power distribution network (PDN) of the substrate 102 and the package 100.

The capacitor 170 includes a capacitor dielectric layer 270, a first terminal 272, a second terminal 274, a first plurality of plates 273, and a second plurality of plates 275. The first plurality of plates 273 is coupled to the first terminal 272. The second plurality of plates 275 is coupled to the second terminal 274. The first terminal 272 may include a metal pad. The first terminal 272 may include a top surface, a bottom surface and a side surface. The second terminal 274 may include a metal pad. The second terminal 274 may include a top surface, a bottom surface and a side surface.

The first plurality of plates 273 and the second plurality of plates 275 are aligned along at least one plane that is parallel to one or more metal layers (e.g., M1, M2, M3) of the substrate 102. The side surface of the first terminal 272 may be perpendicular to the first plurality of plates 273. The side surface of the second terminal 274 may be perpendicular to the second plurality of plates 275. In some implementations, one or more of the plates from the first plurality of plates 273 and/or the second plurality of plates 275 may be planar to a metal layer (e.g., M1) of the substrate 102. The M1 metal layer may be a first metal layer and/or a top metal layer of the substrate 102. The M2 metal layer may be an intermediate metal layer between a top metal layer and a bottom metal layer of the substrate 102. In some implementations, a substrate may include several intermediate metal layers between a top metal layer and a bottom metal layer of a substrate. For example, if a substrate has seven metal layers (e.g., M1-M7), the M1 metal layer may be a top metal layer, the M7 metal layer may be a bottom metal layer, and the M2-M6 metal layers may be intermediate metal layers of the substrate. As will be further described below, different implementations may couple the terminals of the capacitors to different metal layers of the substrate, including a top metal layer, a bottom metal layer and/or an intermediate metal layer.

The capacitor 170 is located at least partially in the substrate 102. The capacitor 170 may be located in a cavity of the substrate 102. Examples of cavities of the substrate 102 are further illustrated and described below in at least FIGS. 8A-8D. It is noted that a substrate 102 may have a cavity even if the cavity is subsequently filled with a component and/or a material. A center portion (or a portion near the center portion) of the side surface of the first terminal 272 may be planar with a side wall of the interconnect 122c, which is located on the M1 metal layer. The solder interconnect 172 is coupled to the side surface of the terminal 272 and a side wall of the interconnect 122c (e.g., trace). A center portion (or a portion near the center portion) of the side surface of the second terminal 274 may be planar with a side wall of the interconnect 122d, which is located on the M1 metal layer. The solder interconnect 174 is coupled to the side surface of the terminal 274 and a side wall of the interconnect 122d (e.g., trace). This configuration and placement of the capacitor 170 in the substrate 102 helps reduce impedance between the capacitor 170 and the substrate 102, which can help reduce voltage droop in the current that is coupled to the capacitor 170. In some implementations, the capacitor 170 and the integrated device 103 may be part of a power distribution network (PDN) of the substrate 102 and the package 100.

It is noted that the package 100 may include different numbers of capacitors that are located and/or embedded through a surface of the substrate 102. It is also noted that instead of capacitor and/or in conjunction with capacitors, other passive devices may also be embedded in the substrate in a similar manner. It is noted that the implementation of the capacitors that is described in the disclosure is not limited to only substrates. It is noted that the capacitors may be implemented in a board (e.g., printed circuit board (PCB)) in a similar manner to provide performance improvements for the device that includes the board. For example, a package that includes a substrate and an integrated device may be coupled to a board. The board may include at least one dielectric layer, a plurality of metal layers, at least one cavity and at least one capacitor that is coupled to a side wall of a metal layer of the board (in a similar manner as described for a capacitor in a substrate).

Figure 3:
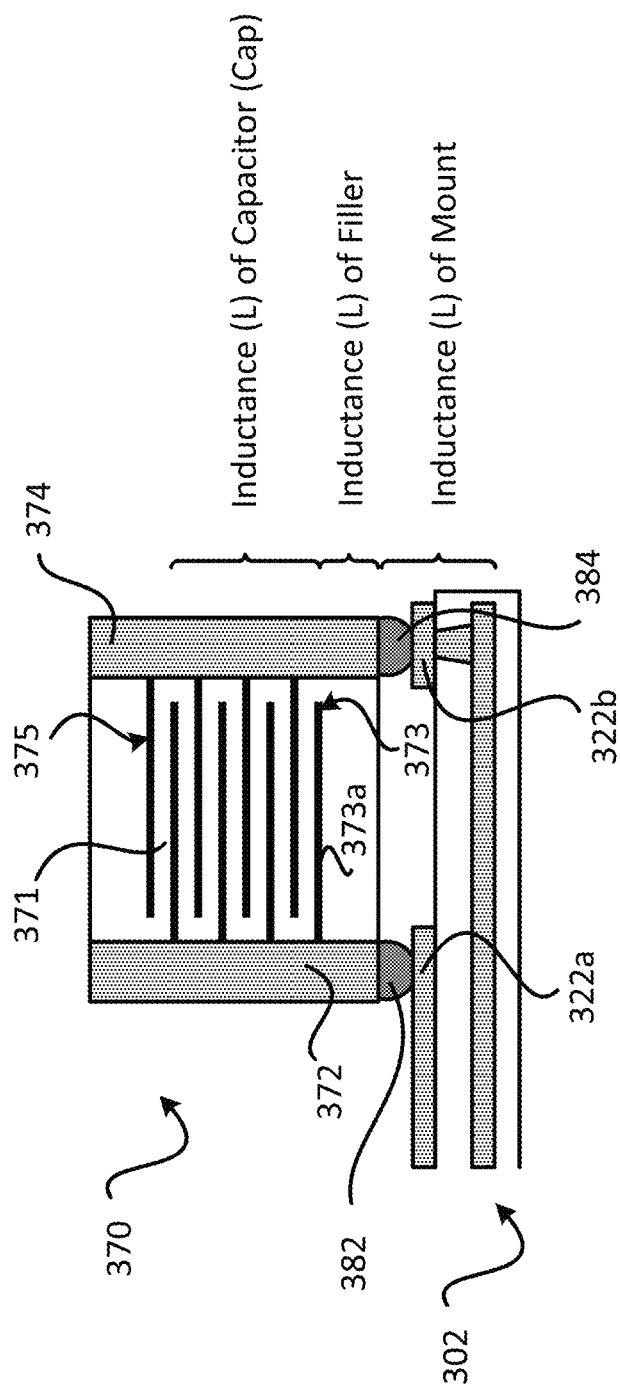
FIG. 3 illustrates a passive device coupled to interconnects of a substrate on non-side walls.

FIG. 3 illustrates how coupling a capacitor may impact the impedance of the capacitor relative to the substrate. FIG. 3 illustrates a capacitor 370 that includes a capacitor dielectric layer 371, a first terminal 372, a second terminal 374, a first plurality of plates 373 and a second plurality of plates 375. The capacitor 370 is coupled to the substrate 302 through a solder interconnect 382 and a solder interconnect 384. The first terminal 372 is coupled to a top surface of the interconnect 322a through the solder interconnect 382. The second terminal 374 is coupled to a top surface of the interconnect 322b through the solder interconnect 384. FIG. 3 illustrates where inductance may come from when a capacitor is coupled to a substrate. As shown in FIG. 3, there may be (i) an inductance associated with how the first plurality of plates 373 and the second plurality of plates 375 are coupled to the terminals of the capacitor 370, (ii) an inductance associated with capacitor dielectric layer 371 within the section between bottom-most metal plate 373a and the solder interconnects 384 or 382 (e.g., filler) and (iii) an inductance associated with the solder interconnect 382, the solder interconnect 384, the interconnect 322a, and the interconnect 322b. As shown in FIG. 3, coupling the capacitor 370 through a bottom surface of the first terminal 372, a bottom surface of the second terminal 374, the solder interconnect 382, a solder interconnect 384, a top surface of interconnect 322a and a top surface of the interconnect 322b, adds inductance to the overall coupling between the capacitor 370 and the substrate 302. One advantage of the configuration and placement of the capacitor(s) shown in FIGS. 1-2, is the reduction of the inductance between the capacitor and the substrate, which means lower impedance between the capacitor and the substrate. For instance, the inductance due to the capacitor section (e.g., filler) between bottom-most metal plate 373a and the solder interconnect 384 or 382 may be reduced or eliminated by coupling the capacitor to the substrate through the side surface and/or side wall of the capacitor. It is noted that the inductance (impedance) due to the capacitor dielectric layer 371 (e.g., filler) may account between about 35% and 50% of the overall inductance (impedance) between the capacitor and the substrate. The total height of a capacitor with a same X-Y dimensions typically may remain the same. However, the filler height may vary in accordance with the capacitor plate (373, 375) count. A capacitor of smaller capacitor value may have fewer first plurality of plates 373 and/or fewer second plurality of plates 375 that may result in higher filler height (higher inductance or impedance of filler). As such, reducing and/or eliminating the impedance associated with the capacitor dielectric layer 371 (e.g., filler) may greatly reduce the overall impedance between the capacitor and the substrate. It is noted that to reduce the impedance to the maximum, the center of the side surface(s) of the terminal of the capacitor (e.g., 160, 170) may be aligned and/or planar as much as possible to a metal layer of the substrate.

FIG. 4 illustrates a chart 400 that includes the impedance profiles of capacitors that are coupled to a substrate differently. As shown in FIG. 4, the chart 400 includes an impedance profile 401 for a capacitor (e.g., 370) that is coupled to the substrate through non-side wall coupling, in a similar manner as shown in FIG. 3. FIG. 4 also shows the chart 400 includes an impedance profile 403 for a capacitor (e.g., 160, 170) that is coupled to a substrate through side wall coupling, in a similar manner as shown in FIGS. 1 and 2. FIG. 4 illustrates that for certain frequencies there is an impedance difference 402 between the impedance profile 401 and the impedance profile 403. Namely, at certain frequencies, a capacitor that is coupled through the side wall of the capacitor and the side surface of interconnects of a substrate has a lower impedance than a similar capacitor coupled to the substrate through non-side wall coupling. In FIG. 4, the impedance difference may be about a 34% improvement in impedance of the side wall coupling versus the non-side wall coupling of the capacitor to the substrate.

FIG. 5 illustrates a chart 500 that includes voltage droop profiles of a PDN with capacitors that are coupled to a substrate differently. As shown in FIG. 5, the chart 500 includes a voltage droop profile 501 for a capacitor (e.g., 370) that is coupled to the substrate through non-side wall coupling, in a similar manner as shown in FIG. 3. FIG. 5 also shows the chart 500 includes a voltage droop profile 503 for a capacitor (e.g., 160, 170) that is coupled to a substrate through side wall coupling, in a similar manner as shown in FIGS. 1 and 2. FIG. 5 illustrates that for the entire duration there is a voltage droop (noise) difference 502 between the voltage droop profile 501 and the voltage droop profile 503. Namely, for the entire duration, a capacitor that is coupled through the side wall of the capacitor and the side surface of interconnects of a substrate has a lower voltage droop than a similar capacitor coupled to the substrate through non-side wall coupling. In FIG. 5, the voltage droop (noise) difference may be about a 27% improvement in voltage droop performance of the side wall coupling versus the non-side wall coupling of the capacitor to the substrate. It is noted that FIGS. 4 and 5 are merely examples of possible performances for capacitors and PDNs with capacitors. Other configurations of the capacitors and PDNs with capacitors may have other performance characteristics.

Exemplary Sequence for Fabricating a Substrate

Figure 6A:
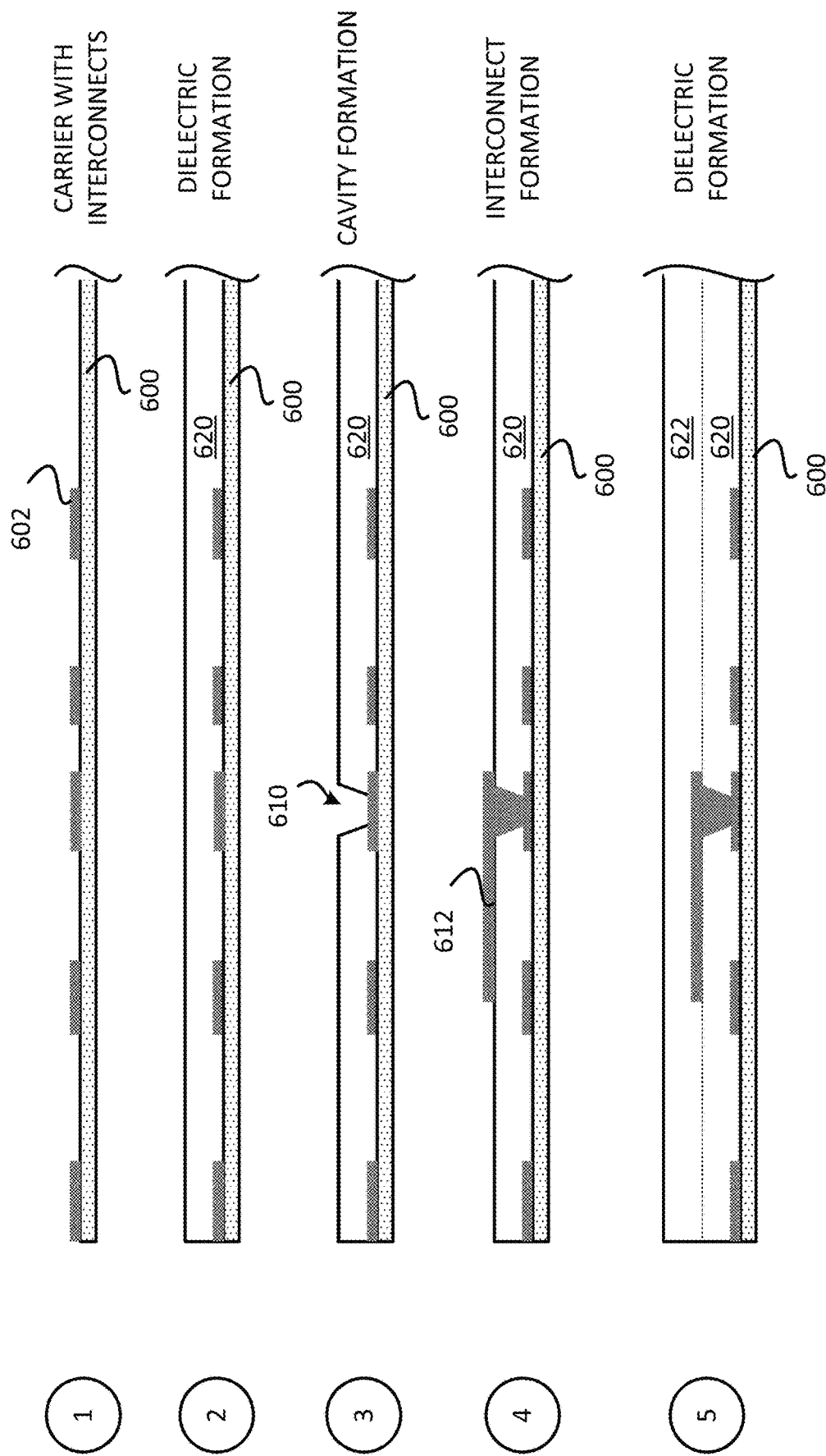
FIGS. 6A-6B illustrate an exemplary sequence for fabricating a substrate.
Figure 6B:
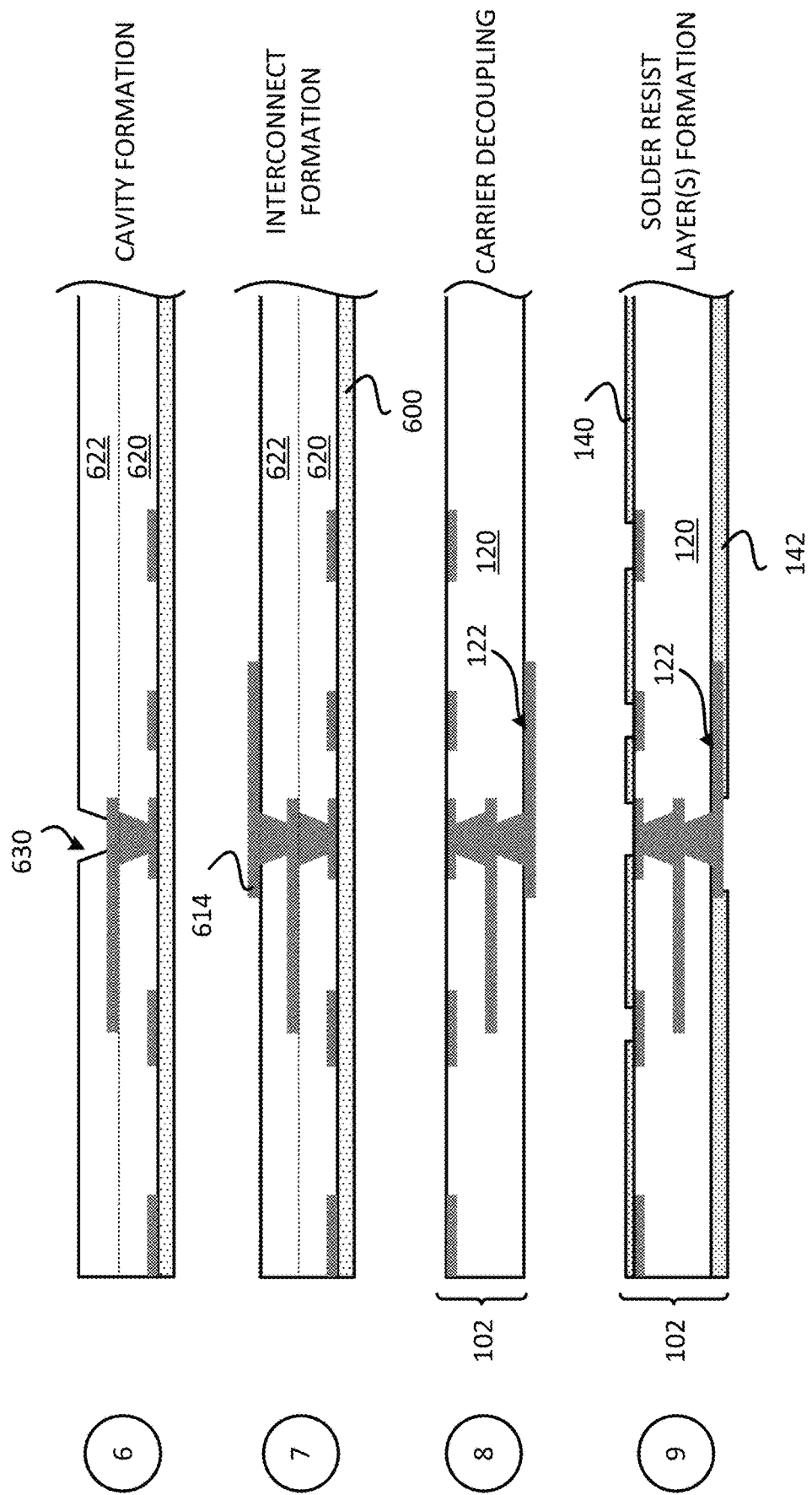

In some implementations, fabricating a substrate includes several processes. FIGS. 6A-6B illustrate an exemplary sequence for providing or fabricating a substrate. In some implementations, the sequence of FIGS. 6A-6B may be used to provide or fabricate the substrate 102 of FIG. 2. However, the process of FIGS. 6A-6B may be used to fabricate any of the substrates described in the disclosure.

It should be noted that the sequence of FIGS. 6A-6B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 6A, illustrates a state after a carrier 600 is provided and a metal layer is formed over the carrier 600. The metal layer may be patterned to form interconnects 602. A plating process and etching process may be used to form the metal layer and interconnects. In some implementations, the carrier 600 may be provided with a metal layer that is patterned to form the interconnects 602.

Stage 2 illustrates a state after a dielectric layer 620 is formed over the carrier 600 and the interconnects 602. The dielectric layer 620 may include polyimide. However, different implementations may use different materials for the dielectric layer.

Stage 3 illustrates a state after a plurality of cavities 610 is formed in the dielectric layer 620. The plurality of cavities 610 may be formed using an etching process (e.g., photo etching process) or laser process.

Stage 4 illustrates a state after interconnects 612 are formed in and over the dielectric layer 620, including in and over the plurality of cavities 610. For example, a via, pad and/or traces may be formed. A plating process may be used to form the interconnects.

Stage 5 illustrates a state after another dielectric layer 622 is formed over the dielectric layer 620. The dielectric layer 622 may be the same material as the dielectric layer 620. However, different implementations may use different materials for the dielectric layer.

Stage 6, as shown in FIG. 6B, illustrates a state after a plurality of cavities 630 is formed in the dielectric layer 622. An etching process or laser process may be used to form the cavities 630.

Stage 7 illustrates a state after interconnects 614 are formed in and over the dielectric layer 622, including in and over the plurality of cavities 630. For example, via, pad and/or trace may be formed. A plating process may be used to form the interconnects.

It is noted that Stages 5 through 7 may be iteratively repeated to form addition metal layers and dielectric layers. Some or all of the interconnects 602, 612, and/or 614 may define a plurality of interconnects 122 of the substrate 102. The dielectric layers 620, and 622 may be represented by the at least one dielectric layer 120.

Stage 8 illustrates a state after the carrier 600 is decoupled (e.g., removed, grinded out) from the dielectric layer 120, leaving the substrate 102 that includes the at least one dielectric layer 120 and the plurality of interconnects 122.

Stage 9 illustrates a state after the solder resist layer 140 and the solder resist layer 142 are formed over the substrate 102. A deposition process may be used to form the solder resist layer 140 and the solder resist layer 142. In some implementations, none or one solder resist layer may be formed over the at least one dielectric layer 120.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). A process similar to the process of FIGS. 6A-6B may be used to fabricate a board (e.g., printed circuit board).

Exemplary Flow Diagram of a Method for Fabricating a Substrate

Figure 7:
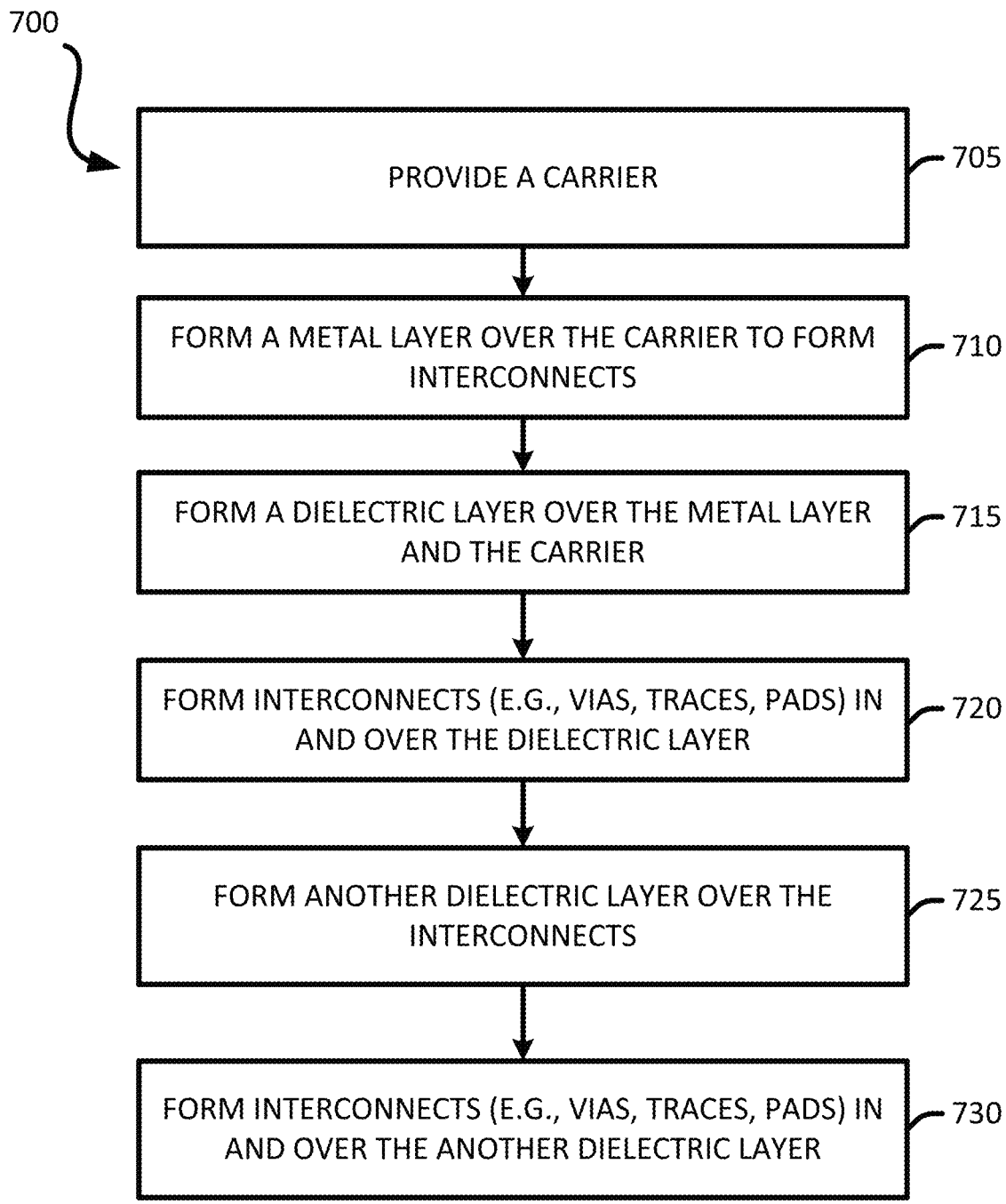
FIG. 7 illustrates an exemplary flow diagram of a method for fabricating a substrate.

In some implementations, fabricating a substrate includes several processes. FIG. 7 illustrates an exemplary flow diagram of a method 700 for providing or fabricating a substrate. In some implementations, the method 700 of FIG. 7 may be used to provide or fabricate the substrate(s) of FIG. 2. For example, the method of FIG. 7 may be used to fabricate the substrate 102.

It should be noted that the method 700 of FIG. 7 may combine one or more processes in order to simplify and/or clarify the method for providing or fabricating a substrate. In some implementations, the order of the processes may be changed or modified.

The method provides (at 705) a carrier 600. Different implementations may use different materials for the carrier. The carrier may include a substrate, glass, quartz and/or carrier tape. Stage 1 of FIG. 6A illustrates and describes an example of a carrier that is provided.

The method forms (at 710) a metal layer over the carrier 600. The metal layer may be patterned to form interconnects. A plating process may be used to form the metal layer and interconnects. In some implementations, the carrier may include a metal layer. The metal layer over the carrier may be patterned to form interconnects (e.g., 602). Stage 1 of FIG. 6A illustrates and describes an example of a metal layer and interconnects that are formed over a carrier.

The method forms (at 715) a dielectric layer 620 over the carrier 600 and the interconnects 602. The dielectric layer 620 may include polyimide. Forming the dielectric layer may also include forming a plurality of cavities (e.g., 610) in the dielectric layer 620. The plurality of cavities may be formed using an etching process (e.g., photo etching) or laser process. Stages 2-3 of FIG. 6A illustrate and describe an example of forming a dielectric layer and cavities in the dielectric layer.

The method forms (at 720) interconnects in and over the dielectric layer. For example, the interconnects 612 may be formed in and over the dielectric layer 620. A plating process may be used to form the interconnects. Forming interconnects may include providing a patterned metal layer over and/or in the dielectric layer. Forming interconnects may also include forming interconnects in cavities of the dielectric layer. Stage 4 of FIG. 6A illustrates and describes an example of forming interconnects in and over a dielectric layer.

The method forms (at 725) a dielectric layer 622 over the dielectric layer 620 and the interconnects. The dielectric layer 622 may include polyimide. Forming the dielectric layer may also include forming a plurality of cavities (e.g., 630) in the dielectric layer 622. The plurality of cavities may be formed using an etching process or laser process. Stages 5-6 of FIGS. 6A-6B illustrate and describe an example of forming a dielectric layer and cavities in the dielectric layer.

The method forms (at 730) interconnects in and/or over the dielectric layer. For example, the interconnects 614 may be formed. A plating process may be used to form the interconnects. Forming interconnects may include providing a patterned metal layer over an in the dielectric layer. Forming interconnects may also include forming interconnects in cavities of the dielectric layer. Stage 7 of FIG. 6B illustrates and describes an example of forming interconnects in and over a dielectric layer.

The method may form additional dielectric layer(s) and additional interconnects as described at 725 and 730.

Once all the dielectric layer(s) and additional interconnects are formed, the method may decouple (e.g., remove, grind out) the carrier (e.g., 600) from the dielectric layer 620, leaving the substrate. In some implementations, the method may form solder resist layers (e.g., 140, 142) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s). A process similar to the method of FIG. 7 may be used to fabricate a board (e.g., printed circuit board).

Exemplary Sequence for Fabricating a Package that Includes a Substrate with an Embedded Capacitor FIGS. 8A-8D illustrate an exemplary sequence for providing or fabricating a package that includes a substrate with an embedded capacitor. In some implementations, the sequence of FIGS. 8A-8D may be used to provide or fabricate the package 100 of FIG. 2, or any of the packages described in the disclosure.

It should be noted that the sequence of FIGS. 8A-8D may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. For example, instead of capacitors, other passive components may be used. The sequence of FIGS. 8A-8D may be used to fabricate one package or several packages at a time (as part of a wafer).

Figure 8A:
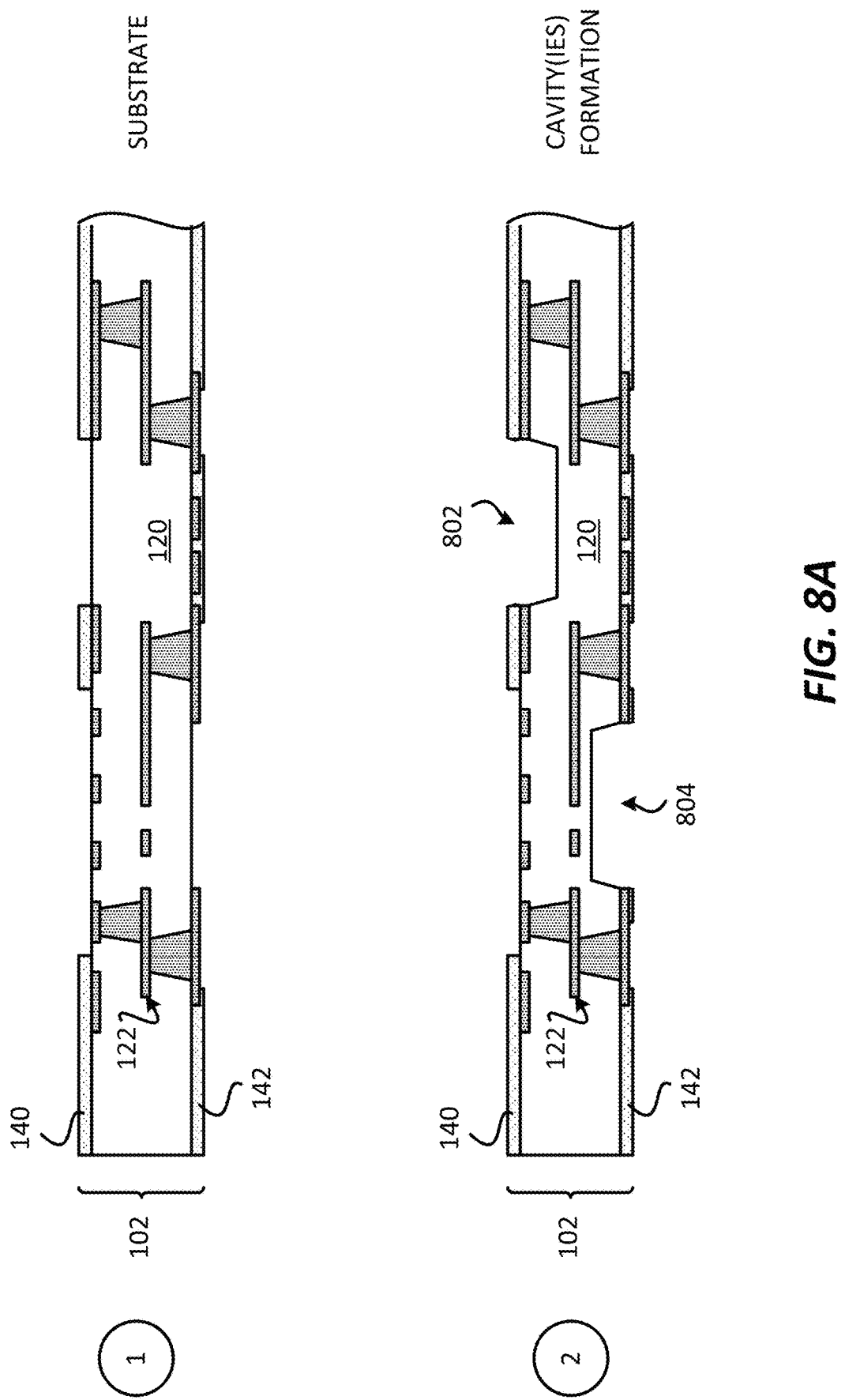

Stage 1, as shown in FIG. 8A, illustrates a state after the substrate 102 is provided. The substrate 102 may be provided by a supplier or fabricated. A process similar to the process shown in FIGS. 6A-6B may be used to fabricate the substrate 102. However, different implementations may use different processes to fabricate the substrate 102. Examples of processes that may be used to fabricate the substrate 102 include, an embedded trace substrate (ETS) process, a semi-additive process (SAP) and a modified semi-additive process (mSAP). The substrate 102 includes at least one dielectric layer 120, a plurality of interconnects 122, a solder resist layer 140 and a solder resist layer 142. The substrate 102 may be a laminate substrate, a coreless substrate, an organic substrate, a substrate that includes a core layer (e.g., cored substrate). In some implementations, at least one dielectric layer 120 may include a core layer and/or prepreg layers. The substrate 102 may include any number of metal layers (e.g., M1, M2, M3, M4, M5, M6, M7).

Stage 2 illustrates a state after a cavity 802 is formed through a first surface of the substrate 102, and a cavity 804 is formed through a second surface of the substrate 102. The cavity 802 may be formed through a top surface of the substrate 102, and the cavity 804 may formed through a bottom surface of the substrate 102. The cavity 802 and the cavity 804 may include a trench. The cavity 802 and the cavity 804 may have different shapes. The size and/or depth of the cavity 802 and/or the cavity 804 may vary. In some implementations, more than one cavity 802 and/or more than one cavity 804 may be formed. Different implementations may form the cavity 802 and/or the cavity 804 differently. The cavity 802 and/or the cavity 804 may be formed by selectively removing portions of the substrate 102. In some implementations, the cavity 802 and/or the cavity 804 may be formed through a laser process (e.g., laser ablation) and/or an etching process. It is noted that the cavity 802 and/or the cavity 804 may be formed during a fabrication of the substrate 102. Thus, in some implementations, the cavity 802 and/or the cavity 804 may be included with the substrate 102, when the substrate 102 is provided by a supplier.

Figure 8B:
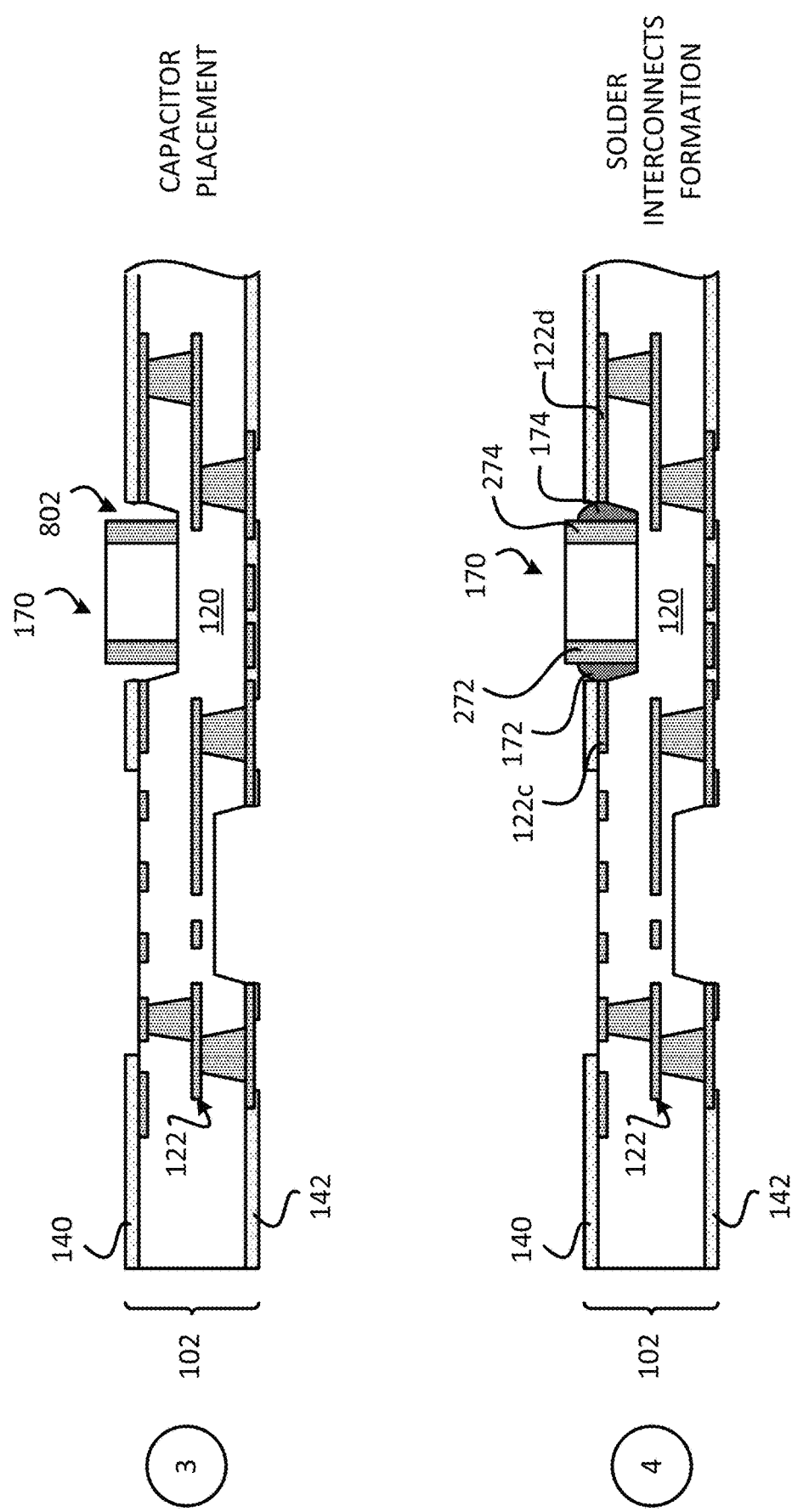

Stage 3, as shown in FIG. 8B, illustrates a state after the capacitor 170 is placed in the cavity 802 of the substrate 102. A pick and place process may be used to place the capacitor 170 in the cavity 802 of the substrate 102.

Stage 4 illustrates a state after the solder interconnect 172 and the solder interconnect 174 are formed in the cavity 802. The solder interconnect 172 is coupled to the interconnect 122c and the first terminal 272 of the capacitor 170. The solder interconnect 174 is coupled to the interconnect 122d and the second terminal 274 of the capacitor 170. A solder reflow process may be used to form and couple the solder interconnect 172 and the solder interconnect 174.

Figure 8C:
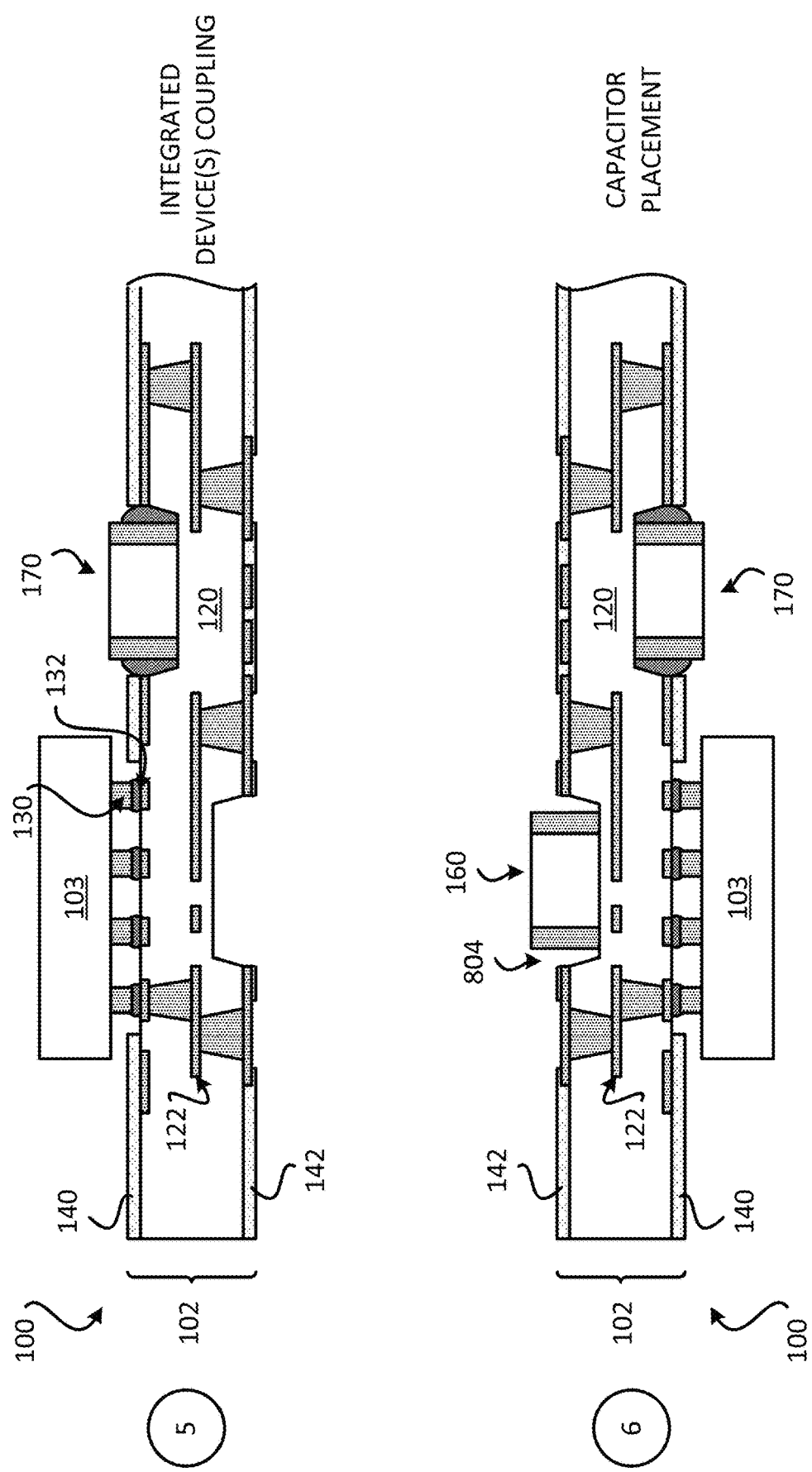

Stage 5, as shown in FIG. 8C, illustrates a state after the integrated device 103 is coupled to a first surface (e.g., top surface) of the substrate 102. The integrated device 103 may be coupled to the substrate 102 through a plurality of pillar interconnects 130 and a plurality of solder interconnects 132.

Stage 6 illustrates a state after the capacitor 160 is placed in the cavity 804 of the substrate 102. A pick and place process may be used to place the capacitor 160 in the cavity 804 of the substrate 102.

Stage 7, as shown in FIG. 8D, illustrates a state after the solder interconnect 162 and the solder interconnect 164 are formed in the cavity 804. The solder interconnect 162 is coupled to the interconnect 122a and the first terminal 262 of the capacitor 160. The solder interconnect 164 is coupled to the interconnect 122b and the second terminal 264 of the capacitor 160. A solder reflow process may be used to form and couple the solder interconnect 162 and the solder interconnect 164.

Stage 8 illustrates a state after the plurality of solder interconnects 150 is coupled to the second surface (e.g., bottom surface) of the substrate 102. The plurality of solder interconnects 150 may be coupled to interconnects from the plurality of interconnects 122 of the substrate 102. A solder reflow process may be used to couple the plurality of solder interconnects 150 to the substrate 102. Stage 8 may illustrate the package 100. The packages (e.g., 100) described in the disclosure may be fabricated one at a time or may be fabricated together as part of one or more wafers and then singulated into individual packages.

Figure 9:
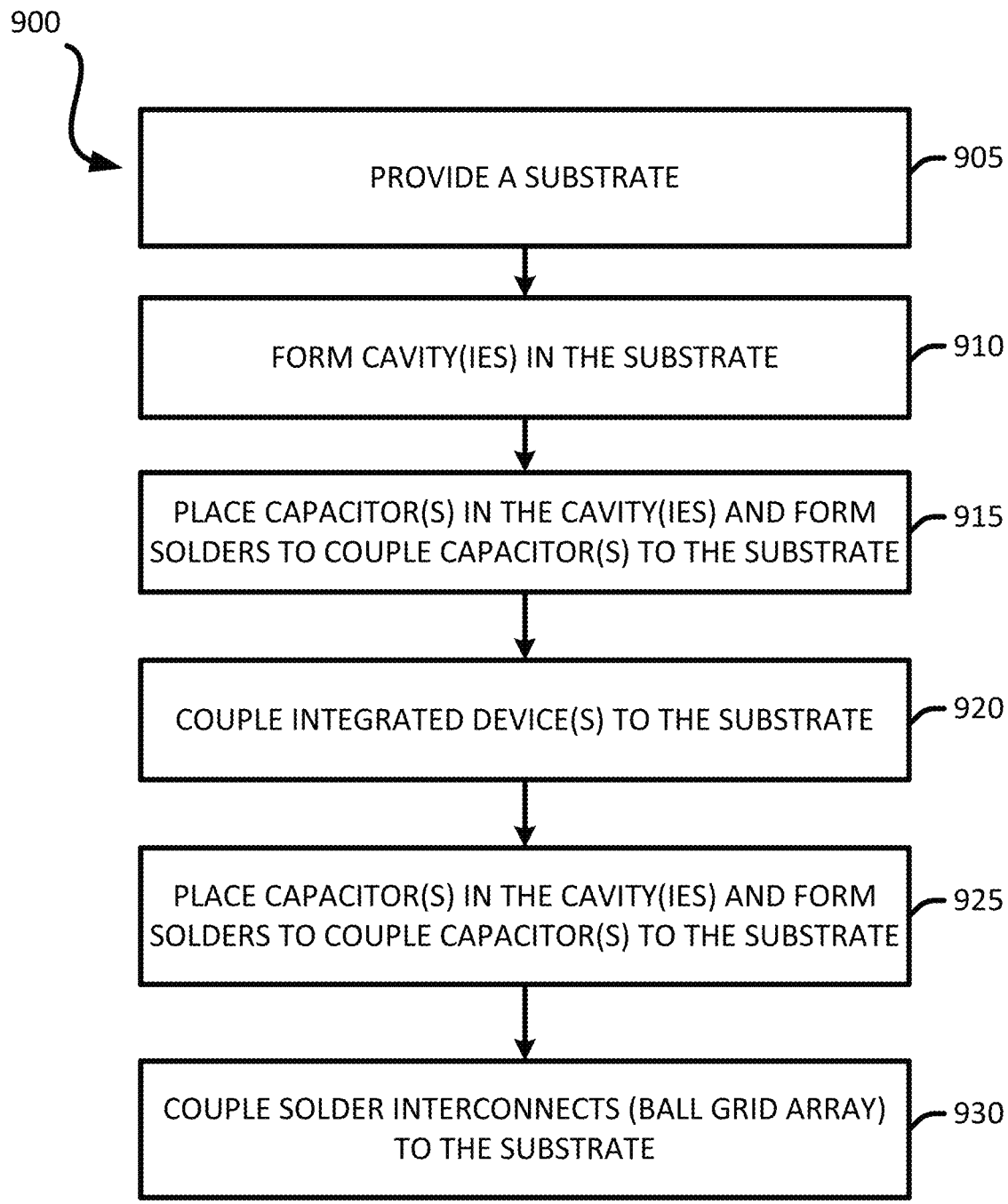
FIG. 9 illustrates an exemplary flow diagram of a method for fabricating a package that includes a substrate with an embedded passive device with side wall coupling.

Exemplary Flow Diagram of a Method for
Fabricating a Package that Includes a Substrate
with an Embedded Capacitor In some implementations, fabricating a package that includes a substrate comprising an embedded capacitor includes several processes. FIG. 9 illustrates an exemplary flow diagram of a method 900 for providing or fabricating a package that includes a substrate comprising an embedded capacitor. In some implementations, the method 900 of FIG. 9 may be used to provide or fabricate the package 100 of FIG. 2 described in the disclosure. However, the method 900 may be used to provide or fabricate any of the packages described in the disclosure.

It should be noted that the method of FIG. 9 may combine one or more processes in order to simplify and/or clarify the method for providing or fabricating a package that includes a substrate comprising an embedded capacitor. In some implementations, the order of the processes may be changed or modified.

The method provides (at 905) a substrate (e.g., 102). The substrate 102 may be provided by a supplier or fabricated. A process similar to the process shown in FIGS. 6A-6B may be used to fabricate the substrate 102. However, different implementations may use different processes to fabricate the substrate 102. Examples of processes that may be used to fabricate the substrate 102 include, an embedded trace substrate (ETS) process, a semi-additive process (SAP) and a modified semi-additive process (mSAP). The substrate 102 may include at least one dielectric layer 120, a plurality of interconnects 122, a solder resist layer 140 and a solder resist layer 142. The substrate 102 may be a laminate substrate, a coreless substrate, an organic substrate, a substrate that includes a core layer (e.g., cored substrate). In some implementations, the at least one dielectric layer 120 may include a core layer and/or prepreg layers. The substrate 102 may include any number of metal layers (e.g., M1, M2, M3, M4, M5, M6, M7). Stage 1 of FIG. 8A illustrates and describes an example of providing a substrate.

The method forms (at 910) at least one cavity (e.g., 802, 804) in the substrate. The cavity may be formed through a first surface of the substrate 102. The cavity may be formed through a second surface of the substrate 102. A cavity may include a trench. The cavity may have different shapes, sizes and/or shapes. Different implementations may form the cavity differently. The cavity may be formed by selectively removing portions of the substrate. In some implementations, the cavity may be formed through a laser process (e.g., laser ablation) and/or an etching process. It is noted that the cavity may be formed during a fabrication of the substrate 102. Thus, in some implementations, the cavity may be included with the substrate 102, when the substrate 102 is provided by a supplier. Stage 2 of FIG. 8B illustrates and describes an example of cavities in a substrate.

The method places (at 915) a capacitor (e.g., 170) in a cavity (e.g., 802) of the substrate 102, and forms (at 915) solder interconnects (e.g., 172, 174) in the cavity (e.g., 802) to couple terminals (e.g., 272, 274) of the capacitor (e.g., 170) to interconnects (e.g., 122c, 122d) of the substrate 102. A pick and place process may be used to place the capacitor in a cavity of a substrate. A reflow solder process may be used to form the solder interconnects. Stage 3 of FIG. 8B illustrates and describes an example of placing a capacitor in a cavity of a substrate. Stage 4 of FIG. 8B illustrates and describes an example of forming solder interconnect to couple a capacitor to interconnects of a substrate.

The method couples (at 920) at least one integrated device (e.g., 103) to a substrate (e.g., 102). The integrated device may be coupled to a first surface of the substrate or a second surface of the substrate. The integrated device (e.g., 103) may be coupled to the substrate (e.g., 102) through a plurality of pillar interconnects (e.g., 130) and/or a plurality of solder interconnects (e.g., 132). Stage 5 of FIG. 8C illustrates and describes an example of coupling an integrated device to a substrate.

The method places (at 925) a capacitor (e.g., 160) in a cavity (e.g., 804) of the substrate 102, and forms (at 925) solder interconnects (e.g., 162, 164) in the cavity (e.g., 804) to couple terminals (e.g., 262, 264) of the capacitor (e.g., 160) to interconnects (e.g., 122a, 122b) of the substrate 102. A pick and place process may be used to place the capacitor in a cavity of a substrate. A reflow solder process may be used to form the solder interconnects. Stage 6 of FIG. 8C illustrates and describes an example of placing a capacitor in a cavity of a substrate. Stage 7 of FIG. 8D illustrates and describes an example of forming solder interconnect to couple a capacitor to interconnects of a substrate.

The method couples (at 930) a plurality of solder interconnects (e.g., 150) to a substrate 102. A solder reflow process may be used to couple the plurality of solder interconnects to interconnects of the substrate 102. Stage 8 of FIG. 8D illustrates and describes an example of coupling a plurality of solder interconnects to a substrate.

Exemplary Electronic Devices

Figure 10:
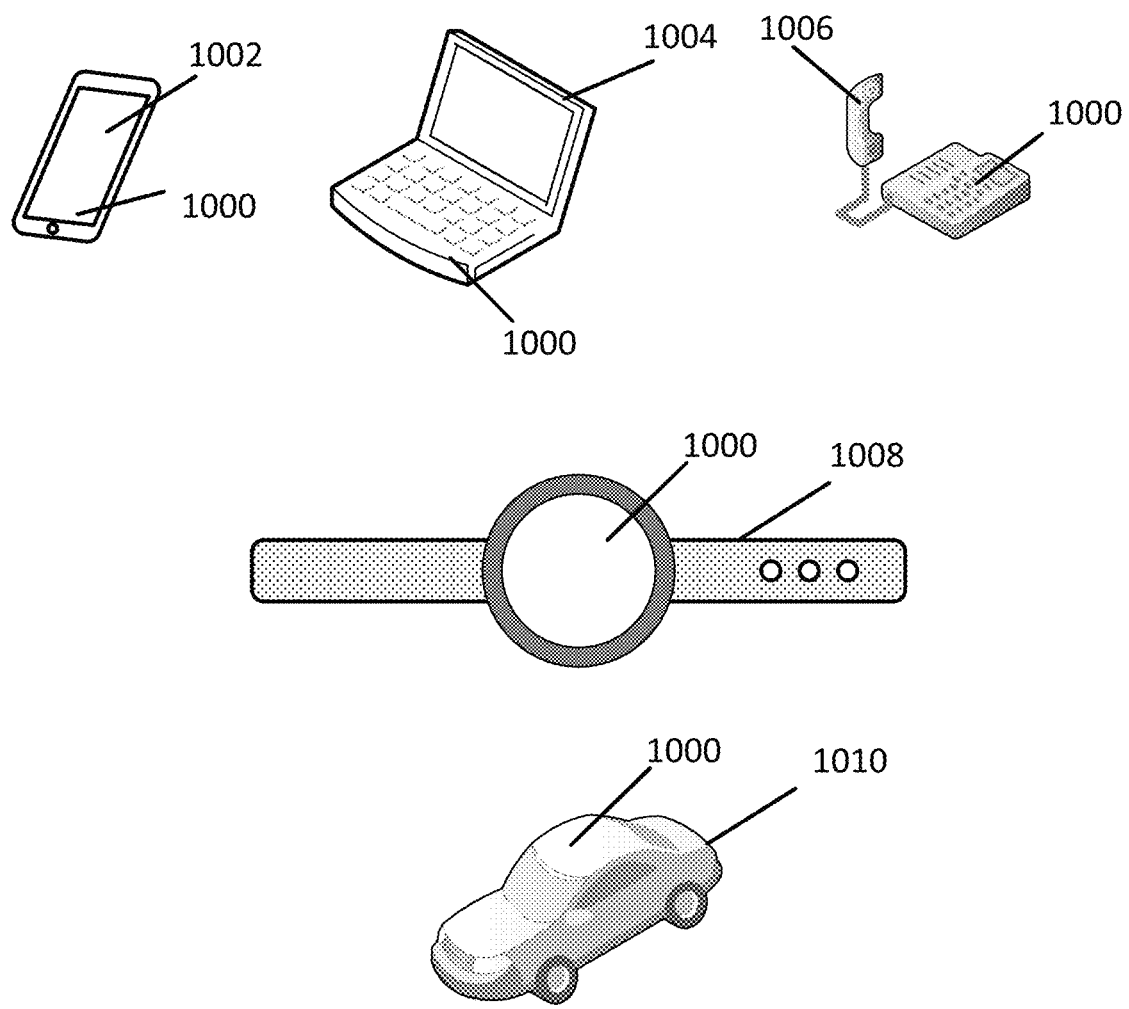
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-5, 6A-6B, 7, 8A-8D, and/or 9-10 may be rearranged and/or combined into a single component, process, feature or function or embodied in several components, processes, or functions. Additional elements, components, processes, and/or functions may also be added without departing from the disclosure. It should also be noted FIGS. 1-5, 6A-6B, 7, 8A-8D, and/or 9-10 and its corresponding description in the present disclosure is not limited to dies and/or ICs. In some implementations, FIGS. 1-5, 6A-6B, 7, 8A-8D, and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a substrate and an integrated device coupled to the substrate. The substrate includes at least one dielectric layer, a plurality of interconnects comprising a first interconnect and a second interconnect, a capacitor located at least partially in the substrate, the capacitor comprising a first terminal and a second terminal, a first solder interconnect coupled to a first side surface of the first terminal and the first interconnect, and a second solder interconnect coupled to a second side surface of the second terminal and the second interconnect.

Aspect 2: The package of aspect 1, wherein a center portion of the first side surface of the first terminal is planar to a metal layer of the substrate.

Aspect 3: The package of aspect 2, wherein the center portion of the first side surface of the first terminal is planar to a bottom metal layer, a top metal layer, or an intermediate metal layer of the substrate.

Aspect 4: The package of aspects 1 through 3, wherein the first side surface of the first terminal faces a side wall of the first interconnect, and wherein the second side surface of the second terminal faces a side wall of the second interconnect.

Aspect 5: The package of aspects 1 through 4, wherein the capacitor comprises a capacitor dielectric layer, a first plurality of plates coupled to the first terminal, and a second plurality of plates coupled to the second terminal.

Aspect 6: The package of aspect 5, wherein the first plurality of plates and the second plurality of plates are aligned along at least one plane that is parallel to one or more metal layers of the substrate.

Aspect 7: The package of aspects 1 through 6, wherein the integrated device and the capacitor are part of a power distribution network (PDN) for the package.

Aspect 8: The package of aspects 1 through 7, wherein the first side surface of the first terminal is perpendicular to the first plurality of plates, and wherein the second side surface of the second terminal is perpendicular to the second plurality of plates.

Aspect 9: The package of aspects 1 through 8, wherein the first terminal comprises a first top surface and a first bottom surface, and wherein the second terminal comprises a second top surface and a second bottom surface.

Aspect 10: The package of aspects 1 through 9, wherein the capacitor is located at least partially in the substrate through a first surface of the substrate or a second surface of the substrate.

Aspect 11: The package of aspects 1 through 10, further comprising a second capacitor located at least partially in the substrate through a first surface of the substrate, wherein the second capacitor comprises a third terminal and a fourth terminal, a third solder interconnect coupled to a first side surface of the third terminal and a third interconnect from the plurality of interconnects, and a fourth solder interconnect coupled to a second side surface of the fourth terminal and a fourth interconnect from the plurality of interconnects.

Aspect 12: The package of aspect 11, wherein the first side surface of the third terminal faces a side wall of the third interconnect, and wherein the second side surface of the fourth terminal faces a side wall of the fourth interconnect.

Aspect 13: A substrate comprising at least one dielectric layer; a plurality of interconnects comprising a first interconnect and a second interconnect; a capacitor located at least partially in the substrate, the capacitor comprising a first terminal and a second terminal; a first solder interconnect coupled to a first side surface of the first terminal and the first interconnect; and a second solder interconnect coupled to a second side surface of the second terminal and the second interconnect.

Aspect 14: The substrate of aspect 13, wherein a center portion of the first side surface of the first terminal is planar to a metal layer of the substrate.

Aspect 15: The substrate of aspect 14, wherein the center portion of the first side surface of the first terminal is planar to a bottom metal layer, a top metal layer, or an intermediate metal layer of the substrate.

Aspect 16: The substrate of aspects 13 through 15, wherein the first side surface of the first terminal faces a side wall of the first interconnect, and wherein the second side surface of the second terminal faces a side wall of the second interconnect.

Aspect 17: The substrate of aspects 13 through 16, wherein the capacitor is part of a power distribution network (PDN) for the substrate.

Aspect 18: The substrate of aspects 13 through 17, wherein the capacitor is located at least partially in the substrate through a first surface of the substrate or a second surface of the substrate.

Aspect 19: The substrate of aspects 13 through 18, further comprising a second capacitor located at least partially in the substrate through a first surface of the substrate, wherein the second capacitor comprises a third terminal and a fourth terminal; a third solder interconnect coupled to a first side surface of the third terminal and a third interconnect from the plurality of interconnects; and a fourth solder interconnect coupled to a second side surface of the fourth terminal and a fourth interconnect from the plurality of interconnects.

Aspect 20: The substrate of aspects 13 through 19, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 21: A board comprising at least one dielectric layer; a plurality of interconnects comprising a first interconnect and a second interconnect; a capacitor located at least partially in the board, the capacitor comprising a first terminal and a second terminal; a first solder interconnect coupled to a first side surface of the first terminal and the first interconnect; and a second solder interconnect coupled to a second side surface of the second terminal and the second interconnect. The board may include a printed circuit board (PCB).

Aspect 22: The board of aspect 21, wherein a center portion of the first side surface of the first terminal is planar to a metal layer of the board.

Aspect 23: The board of aspect 22, wherein the center portion of the first side surface of the first terminal is planar to a bottom metal layer, a top metal layer, or an intermediate metal layer of the board.

Aspect 24: The board of aspects 21 through 23, wherein the first side surface of the first terminal faces a side wall of the first interconnect, and wherein the second side surface of the second terminal faces a side wall of the second interconnect.

Aspect 25: The board of aspects 21 through 24, wherein the capacitor is part of a power distribution network (PDN) for the board.

Aspect 26: The board of aspects 21 through 25, wherein the capacitor is located at least partially in the board through a first surface of the board or a second surface of the board.

Aspect 27: The board of aspects 21 through 26, further comprising: a second capacitor located at least partially in the board through a first surface of the board, wherein the second capacitor comprises a third terminal and a fourth terminal; a third solder interconnect coupled to a first side surface of the third terminal and a third interconnect from the plurality of interconnects; and a fourth solder interconnect coupled to a second side surface of the fourth terminal and a fourth interconnect from the plurality of interconnects.

Aspect 28: A method for fabricating a package. The method provides a substrate comprising at least one dielectric layer; a plurality of interconnects comprising a first interconnect and a second interconnect; and at least one cavity located in the substrate. The method places a capacitor at least partially in the cavity of the substrate. The capacitor comprises a first terminal and a second terminal. The method couples a first solder interconnect to a first side surface of the first terminal and the first interconnect. The method couples a second solder interconnect to a second side surface of the second terminal and the second interconnect. The method couples an integrated device to the substrate.

Aspect 29: The method of aspect 28, wherein the capacitor is placed at least partially in the cavity of the substrate such that a center portion of the first side surface of the first terminal is planar to a metal layer of the substrate.

Aspect 30: The method of aspect 29, wherein the center portion of the first side surface of the first terminal is planar to a bottom metal layer, a top metal layer, or an intermediate metal layer of the substrate.

Aspect 31: The method of aspects 28 through 30, wherein the capacitor is placed at least partially in the cavity of the substrate such that (i) the first side surface of the first terminal faces a side wall of the first interconnect, and (ii) the second side surface of the second terminal faces a side wall of the second interconnect.

Aspect 32: The method of aspects 28 through 31, wherein the capacitor is placed at least partially in the cavity of the substrate such that the capacitor is located at least partially in the substrate through a first surface of the substrate or a second surface of the substrate.

Aspect 33: The method of aspects 28 through 32, further comprising placing a second capacitor at least partially in a second cavity of the substrate through a first surface of the substrate, wherein the second capacitor comprises a third terminal and a fourth terminal; coupling a third solder interconnect to a first side surface of the third terminal and a third interconnect from the plurality of interconnects; and coupling a fourth solder interconnect to a second side surface of the fourth terminal and a fourth interconnect from the plurality of interconnects.

Aspect 34: The method of aspects 28 through 33, wherein the at least one cavity located in the substrate is formed in the substrate by selectively removing portions of the substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising:
at least one dielectric layer;
a plurality of interconnects comprising a first interconnect and a second interconnect;
a capacitor located at least partially in the substrate, the capacitor comprising a first terminal and a second terminal,
wherein a part of the capacitor directly touches the at least one dielectric layer of the substrate,
wherein the first terminal includes a first top surface, a first bottom surface and a first side surface, and
wherein the second terminal includes a second top surface, a second bottom surface and a second side surface;
a first solder interconnect coupled to the first side surface of the first terminal and a first side wall of the first interconnect, wherein the first side surface of the first terminal faces the first side wall of the first interconnect; and
a second solder interconnect coupled to the second side surface of the second terminal and a second side wall of the second interconnect, wherein the second side surface of the second terminal faces the second side wall of the second interconnect;
wherein the substrate comprises a first surface and a second surface,
wherein the capacitor is embedded partially in the substrate through the second surface of the substrate, and
an integrated device coupled to the first surface of the substrate, wherein the integrated device vertically overlaps with at least a portion of the capacitor.

2. The package of claim 1, wherein a center portion of the first side surface of the first terminal shares a horizontal plane with a metal layer of the substrate.

3. The package of claim 1, wherein the center portion of the first side surface of the first terminal shares a horizontal plane with a bottom metal layer, a top metal layer, or an intermediate metal layer of the substrate.

4. The package of claim 1,
wherein the first interconnect extends horizontally along a metal layer of the substrate, and
wherein the second interconnect extends horizontally along the metal layer of the substrate.

5. The package of claim 1, wherein the capacitor comprises:
a capacitor dielectric layer;
a first plurality of plates coupled to the first terminal; and
a second plurality of plates coupled to the second terminal.

6. The package of claim 5, wherein the first plurality of plates and the second plurality of plates are aligned along at least one horizontal plane that is parallel to one or more metal layers of the substrate.

7. The package of claim 1, wherein the integrated device and the capacitor are part of a power distribution network (PDN) for the package.

8. The package of claim 1,
wherein the first side surface of the first terminal is perpendicular to the first plurality of plates, and
wherein the second side surface of the second terminal is perpendicular to the second plurality of plates.

9. The package of claim 1, wherein the first interconnect and the second interconnect are different interconnects on a same horizontal metal layer of the substrate.

10. The package of claim 1, wherein the capacitor is located at least partially in the substrate through a first surface of the substrate or a second surface of the substrate.

11. The package of claim 1, further comprising:
a second capacitor located at least partially in the substrate through a first surface of the substrate, wherein the second capacitor comprises a third terminal and a fourth terminal;
a third solder interconnect coupled to a first side surface of the third terminal and a third interconnect from the plurality of interconnects; and
a fourth solder interconnect coupled to a second side surface of the fourth terminal and a fourth interconnect from the plurality of interconnects.

12. The package of claim 11,
wherein the first side surface of the third terminal faces a side wall of the third interconnect, and
wherein the second side surface of the fourth terminal faces a side wall of the fourth interconnect.

13. A method for fabricating a package, comprising:
providing a substrate comprising:
  at least one dielectric layer;
  a plurality of interconnects comprising a first interconnect and a second interconnect; and
  at least one cavity located in the substrate;
placing a capacitor at least partially in the cavity of the substrate, the capacitor comprising a first terminal and a second terminal,
  wherein the capacitor is placed such that a part of the capacitor directly touches the at least one dielectric layer of the substrate,
  wherein the first terminal includes a first top surface, a first bottom surface and a first side surface, and
  wherein the second terminal includes a second top surface, a second bottom surface and a second side surface;
coupling a first solder interconnect to the first side surface of the first terminal and a first side wall of the first interconnect, wherein the first side surface of the first terminal faces the first side wall of the first interconnect;
coupling a second solder interconnect to the second side surface of the second terminal and a second side wall of the second interconnect, wherein the second side surface of the second terminal faces the second side wall of the second interconnect; and
coupling an integrated device to a first surface of the substrate, wherein the integrated device vertically overlaps with at least a portion of the capacitor.

14. The method of claim 13, wherein the capacitor is placed at least partially in the cavity of the substrate such that a center portion of the first side surface of the first terminal shares a horizontal plane with a metal layer of the substrate.

15. The method of claim 13, wherein the center portion of the first side surface of the first terminal shares a horizontal plane with a bottom metal layer, a top metal layer, or an intermediate metal layer of the substrate.

16. The method of claim 13,
wherein the first solder interconnect is coupled to the first side surface of the first terminal and the first side wall of the first interconnect such that part of the first solder interconnect is located between the first side surface of the first terminal and the first side wall of the first interconnect, and
wherein the second solder interconnect is coupled to the second side surface of the second terminal and the second side wall of the second interconnect such that part of the second solder interconnect is located between the second side surface of the second terminal and the second side wall of the first interconnect.

17. The method of claim 13, wherein the capacitor is placed at least partially in the cavity of the substrate such that the capacitor is located at least partially in the substrate through a first surface of the substrate or a second surface of the substrate.

18. The method of claim 13, further comprising:
placing a second capacitor at least partially in a second cavity of the substrate through a first surface of the substrate, wherein the second capacitor comprises a third terminal and a fourth terminal;
coupling a third solder interconnect to a first side surface of the third terminal and a third interconnect from the plurality of interconnects; and
coupling a fourth solder interconnect to a second side surface of the fourth terminal and a fourth interconnect from the plurality of interconnects.

19. The method of claim 13, wherein the at least one cavity located in the substrate is formed in the substrate by selectively removing portions of the substrate.

* * * * *